US008581416B2

(12) United States Patent
Massie et al.

(10) Patent No.: US 8,581,416 B2
(45) Date of Patent: Nov. 12, 2013

(54) METHOD OF FORMING A SEMICONDUCTOR DEVICE AND LEADFRAME THEREFOR

(75) Inventors: Harold L. Massie, Medical Lake, WA (US); Phillip Celaya, Gilbert, AZ (US); David F. Moeller, Buda, TX (US); Mark Randol, Austin, TX (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 54 days.

(21) Appl. No.: 13/327,032

(22) Filed: Dec. 15, 2011

(65) Prior Publication Data
US 2013/0154073 A1 Jun. 20, 2013

(51) Int. Cl.
*H01L 23/48* (2006.01)
*H01L 23/52* (2006.01)
*H01L 29/40* (2006.01)
*H01L 23/495* (2006.01)
*H01L 21/00* (2006.01)

(52) U.S. Cl.
USPC ........... 257/775; 257/676; 438/107; 438/111; 438/123

(58) Field of Classification Search
USPC .................. 438/107, 111, 123; 257/676, 775
See application file for complete search history.

(56) References Cited

U.S. PATENT DOCUMENTS

| | | | | |
|---|---|---|---|---|
| 5,057,906 A | * | 10/1991 | Ishigami | 257/706 |
| 6,060,772 A | * | 5/2000 | Sugawara et al. | 257/678 |
| 6,841,869 B1 | * | 1/2005 | Triantafyllou et al. | 257/723 |
| 6,979,909 B2 | * | 12/2005 | Shinohara | 257/796 |
| 7,271,470 B1 | * | 9/2007 | Otremba | 257/666 |
| 7,777,315 B2 | | 8/2010 | Noquil | |
| 2004/0061221 A1 | * | 4/2004 | Schaffer | 257/723 |
| 2005/0285238 A1 | | 12/2005 | Joshi et al. | |
| 2007/0096274 A1 | * | 5/2007 | Pavier et al. | 257/676 |
| 2007/0249092 A1 | * | 10/2007 | Joshi et al. | 438/107 |
| 2007/0267726 A1 | | 11/2007 | Noquil | |
| 2008/0061396 A1 | | 3/2008 | Havanur | |
| 2008/0197463 A1 | * | 8/2008 | Otremba | 257/676 |

OTHER PUBLICATIONS

Fairchild Semiconductor, "FDMF8704V High Efficiency/High Frequency FET plus Driver Multi-chip Module with Internal voltage Regulator", Data Sheet, Nov. 2007, FDMF8704V Rev. G, copyright 2007 Fairchild Semiconductor Corporation, 11 pages.
Semiconductor Components Industries, LLC, "NCP5360R Integrated Driver and MOSFET", Copyright 2010, Publication Order Number: NCP5360R/D Jun. 2010—Rev. 0, 7 pages.
Semiconductor Components Industries, LLC, "NCP5369OR Integrated Driver and MOSFET", Copyright 2011, Publication Order Number: NCP5369/D Jun. 2011—Rev. 3, 7 pages.
Vishay, "Integrated DrMOS Power Stage SiC762CD", Vishay Siliconix, Document Number: 65727 S10-0275-Rev. A, Feb 8, 2010, 18 pages.
Renesas Electronics Corporation, Application Note, Technology Website, "R2J20701NP 2phase POL EVB2; R2J20701NP Evaluation Board", REJ05G0009-0100/Rev.1.00 Jul. 2007, 14 pages.

* cited by examiner

*Primary Examiner* — Fernando L Toledo
*Assistant Examiner* — Karen Kusumakar
(74) *Attorney, Agent, or Firm* — Robert F. Hightower (57) ABSTRACT

In one embodiment, a leadframe for a semiconductor package includes a source connection area for one transistor and a drain connection point for a second transistor, and a common connection for using a connection clip to couple a drain of the first transistor to a source of the second transistor and to the common connection.

20 Claims, 5 Drawing Sheets

METHOD OF FORMING A SEMICONDUCTOR DEVICE AND LEADFRAME THEREFOR

BACKGROUND OF THE INVENTION

The present invention relates, in general, to electronics, and more particularly, to semiconductors, structures thereof, and methods of forming semiconductor devices.

In the past, the semiconductor industry utilized various methods and structures in order to form metal oxide semiconductor (MOS) power transistors and drivers for the MOS power transistors in a common semiconductor package. In some implementations, there were parasitic inductances that, at high switching rates, often caused damage to the driver and/or to the power transistor.

In some implementations, the power return connection for the driver circuit was common with the power return connection of one of the MOS power transistors. A parasitic inductance could be formed by the connection from the power return of the MOS power transistor to the common supply node, such as to a ground connection. At high switching rates, there was a very high di/dt current which resulted in a large voltage between the power return connection of the driver and the circuits that were controlling the driver. These high voltages typically damaged the driver circuit and the power transistor.

In some other implementations, the power return for the driver circuit was separate from the power return for the power transistor. However, the driver still had to support a large current at the output since the voltage resulting from the parasitic inductance was coupled back into the driver output. This voltage also could damage the driver circuit.

Accordingly, it is desirable to have a device with an integrated power transistor and driver that reduces parasitic inductance.

For simplicity and clarity of the illustration(s), elements in the figures are not necessarily to scale, and the same reference numbers in different figures denote the same elements, unless stated otherwise. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, and that conductivity type does not refer to the doping concentration but the doping type, such as P-type of N-type. It will be appreciated by those skilled in the art that the words during, while, and when as used herein relating to circuit operation are not exact terms that mean an action takes place instantly upon an initiating action but that there may be some small but reasonable delay, such as various propagation delays, between the reaction that is initiated by the initial action. Additionally, the term while means that a certain action occurs at least within some portion of a duration of the initiating action. The use of the word about, approximately, or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

DETAILED DESCRIPTION OF THE DRAWINGS

Figure 1:
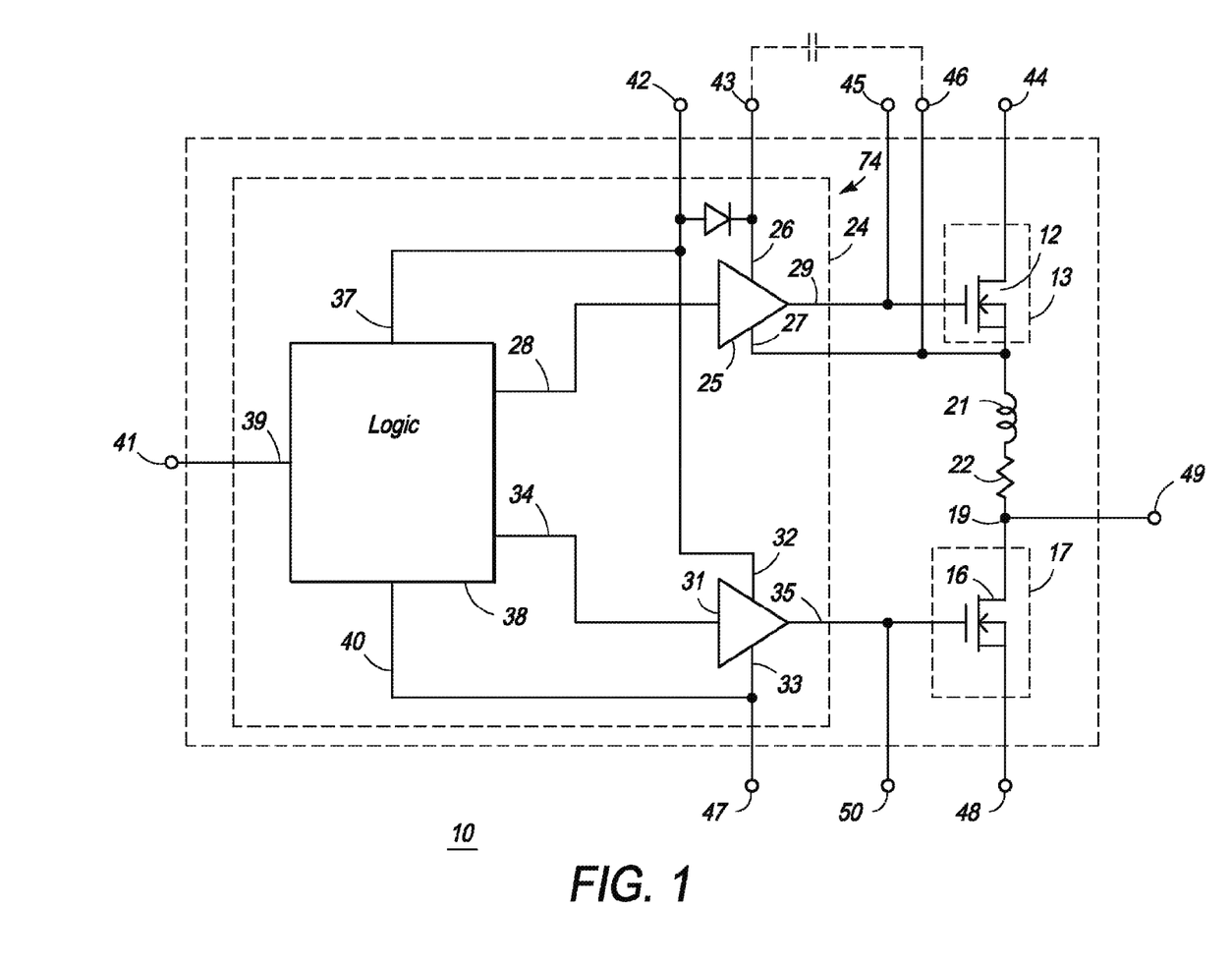
FIG. 1 schematically illustrates an example of a portion of an embodiment of a semiconductor device in accordance with the present invention.

FIG. 1 schematically illustrates an example of a portion of an embodiment of a semiconductor device 10 that includes a first power transistor 12, a second power transistor 16, and a driver and control circuit 24. In the preferred embodiment, transistors 12 and 16 are MOS power transistors. In other embodiments, transistors 12 and 16 may be different types of transistors. Also in the preferred embodiment, transistors 12 and 16 are connected in a stacked totem pole or half bridge configuration with the source of transistor 12 connected to the drain of transistor 16 and to an output or output terminal 49 of device 10 at a node 19. Output terminal 49 typically is referred to as a switch node. An inductor 21 and a resistor 22 represent parasitic inductance and resistance that may be present in the connection between the source of transistor 12 and the drain of transistor 16. An input terminal or input 44 of device 10 is configured to receive a voltage from an external voltage source, such as a dc voltage, that is coupled to output terminal 49 by transistor 12. Transistor 12 is switched to control the amount of power that is coupled to output terminal 49 from input 44. A source of transistor 16 is connected to a power return terminal 48 of device 10.

In the preferred embodiment, circuit 24 includes an input terminal 41 for receiving a control signal, such as a pulse width modulated (PWM) control signal from a PWM power supply controller (not shown). Circuit 24 typically includes a control logic block or logic 38 that receives the control signal on an input 39 of logic 38 and forms switching control signals on outputs 28 and 34 that are used to control transistors 12 and 16. Typically, the switching control signals on outputs 28 and 34 are non-overlapping control signals used to control a high side transistor and a low side transistor. Those skilled in the art will appreciate that circuit 24 may receive more than one control signal and may have more than one terminal 41 such as in an embodiment where circuit 24 may receive two control signals to control transistors 12 and 16. Circuit 24 also typically includes a first driver 25 that receives one of the switching control signals and forms a switching drive signal on an output 29 that has sufficient current drive and voltage to drive one of the power transistors. A second driver 31 of circuit 24 similarly receives the second of the switching control signals and forms another switching drive signal on an output 35 that has sufficient current drive and voltage to drive another one of the power transistors.

A voltage input terminal 42 of device 10 is configured to receive a voltage suitable for supplying an operating voltage for operating logic 38 and for operating driver 31. Driver 25 generally is configured to be connected to a bootstrap circuit in order to receive power for operating driver 25. For such an embodiment, device 10 generally includes a boost input terminal 43 that is used to provide a connection to the boost circuit, illustrated in a general way by dashed lines. In some embodiments, the source of transistor 12 may be configured to be connected to a terminal 46 in order to provide a terminal to assist in forming the boost circuit. In the preferred embodiment, the boost circuit is connected to terminal 49. In some embodiments, the connection to terminal 46 may be omitted. Driver 25 typically is isolated from terminal 42 in order to allow driver 25 to have a floating power supply voltage. A diode is used to illustrate one method of providing such isolation; however, other isolation techniques may be used. A voltage input 37 of logic 38 is configured to receive the operating voltage from terminal 42. Logic 38 also usually has a voltage return 40 that is configured to be connected to a common return voltage, a ground connection for example. A power return 27 of driver 25 is commonly connected to the source of transistor 12 in order to provide a common voltage reference point for the drive voltage supplied to transistor 12. In some embodiments, the gate of transistor 12 optionally may be connected to an external terminal 45. A voltage return 33 of driver 31 is connected to an external voltage return terminal 47 of device 10 and also connected to voltage return 40 of logic 38. Thus, logic 38 and driver 31 have the same operating voltage and a common voltage return.

Figure 2:
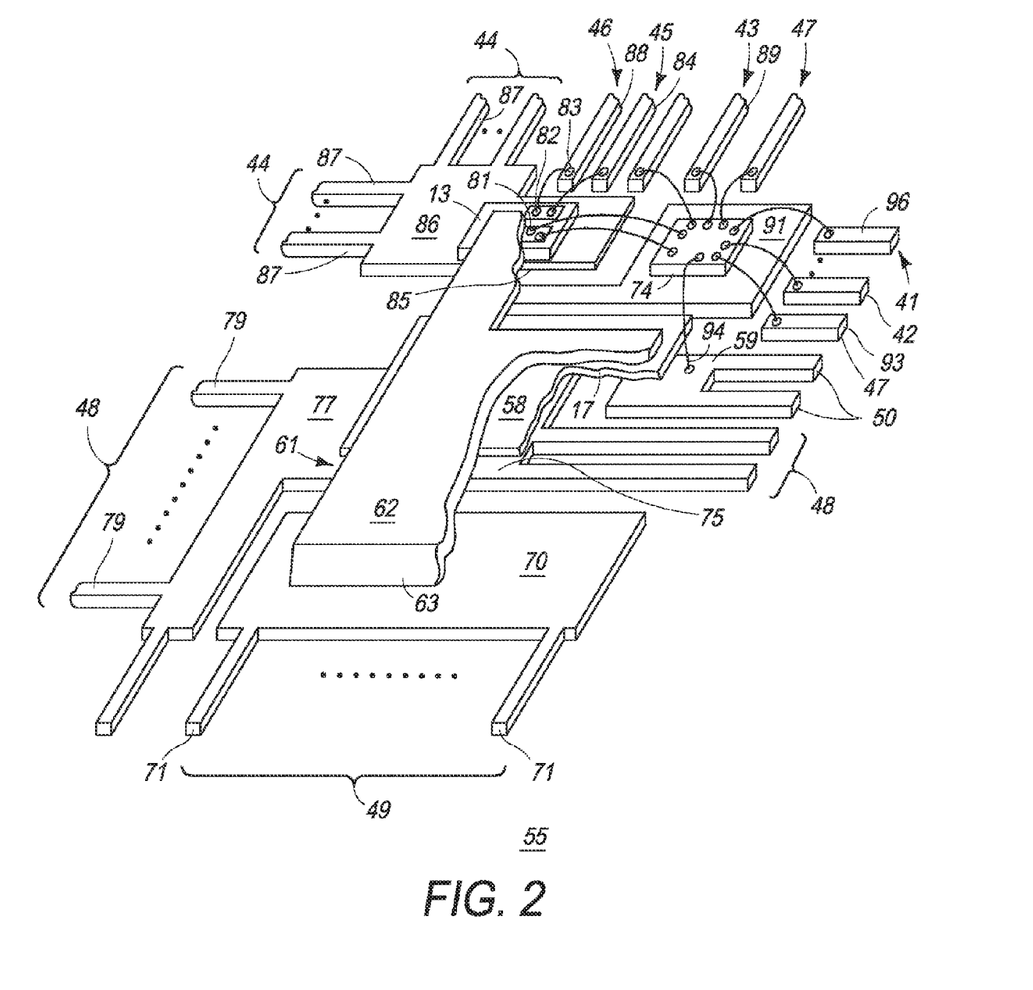
FIG. 2 illustrates a cut-away isometric view of a portion of a semiconductor package that includes the semiconductor device of FIG. 1 in accordance with the present invention.

FIG. 2 illustrates a cut-away isometric view of a portion of a semiconductor package 55 in which device 10 may be formed. For clarity of the explanation and illustration, FIG. 2 illustrates package 55 without an encapsulant. In the preferred embodiment, package 55 is a 40 terminal QFN package. In other embodiments, package 55 may be other package styles such as a PLCC or DIP package and may have more or fewer external connection terminals.

Figure 3:
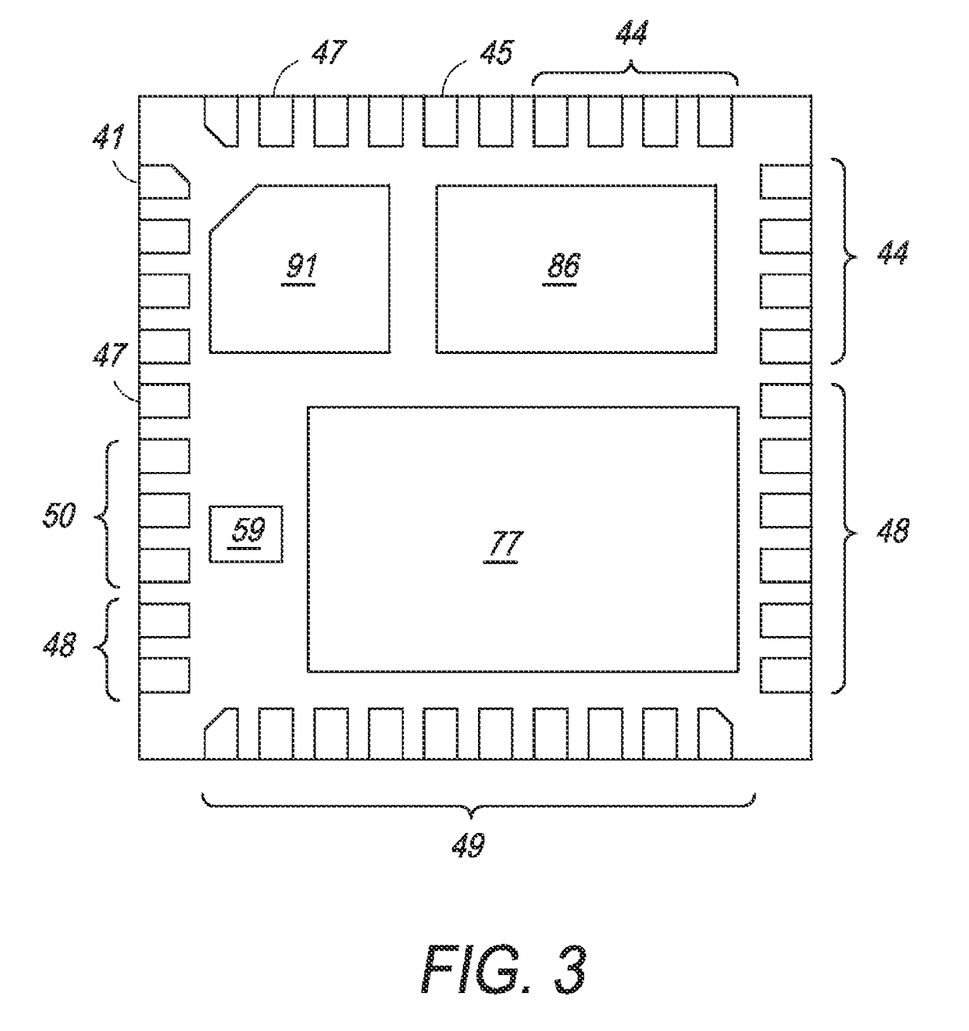
FIG. 3 illustrates a bottom plan view of the semiconductor package of FIG. 2 in accordance with the present invention.

FIG. 3 illustrates a bottom plan view of package 55 subsequent to encapsulation. This explanation has references to FIGS. 1-3. A leadframe for package 55 includes die attachment areas for attaching the semiconductor die of the devices used to form device 10. Those skilled in the art will understand that the die attachment areas are often referred to as flag areas or flags. A first die attachment area 75 of the leadframe is formed for receiving a first semiconductor die 17 on which transistor 16 is formed. The material used for forming first die attachment area 75 usually is larger than area 75 and includes a portion 77 that extends away from area 75 and is formed into leads 79 that facilitate forming an electrical connection to elements of die 17 and to terminal 48. In the preferred embodiment, portion 77 is configured to form a plurality of leads 79 that form plurality of terminals for the terminal illustrated in FIG. 2 as terminal 48. A second die attachment area 85 of the leadframe is formed to receive a second semiconductor die 13 on which transistor 12 is formed. The material use for forming second die attachment area 85 usually is larger than area 85 and includes a portion 86 that extends away from area 85 and is formed into leads 87 that facilitate forming an electrical connection to elements of die 13. In the preferred embodiment, portion 86 is configured to form a plurality of leads 87 that form a plurality of terminals for the terminal illustrated in FIG. 2 as terminal 44. The leadframe also includes a lead connection area 70 that facilitates interconnecting terminal 49 to elements of die 13 and 17. A portion of lead connection area 70 is utilized to form a plurality of leads 71 form a plurality of terminals for the terminal illustrated in FIG. 2 as terminal 49. The leadframe also includes a third die attachment area 91 which is formed to receive a third semiconductor die 74 on which circuit 24 is formed.

The leadframe also includes other leads which are used to form electrical connections to various portions of circuit 24 and transistors 12 and 16 including leads 84, 88, 89, 90, and 96 that form respective terminals 45, 46, 43, 42, and 41. Those skilled in the art will appreciate that the leadframe typically is formed by stamping or coining half-etching, or other well-known leadframe forming technique. During formation of the leadframe, tie bars or other elements may be used to hold the elements of the leadframe together and in a spatial orientation prior to and during the process of forming package 55. These tie bars or other elements typically are excised during the process of forming package 55. Those skilled in the art will also appreciate that in the finished package, areas 70, 75, 85, and 91 are not directly electrically connected together but may be electrically interconnected by other elements such as wire bonds, connection clips, or other well-known interconnection elements.

In most embodiments, the source and gate of transistors 12 and 16 are formed on one surface of respective die 13 and 17, and the drains of the transistors are formed on a second surface of the respective die. Die 17 is attached to the leadframe so that the source connection of transistor 16 is mechanically and electrically connected to area 75, such as by applying a die attachment material to area 75 or by other well-known techniques. Die 17 is disposed on the leadframe so that a gate of transistor 16 is attached to a gate connection area 59 of the leadframe, such as via a similar manner. In this configuration, the drain of transistor 16 is on a surface 58 of die 17 which faces away from die attachment area 75. Die 13 is attached to the leadframe with the drain of transistor 12 mechanically and electrically attached to die attachment area 85, such as by similar a die attachment techniques. A source connection of transistor 12, such as a source connection pad 81, and a gate connection, such as a gate connection pad 82, of transistor 12 are on a surface of die 13 that is opposite to the surface on which the drain of transistor 12 is formed.

Die 74 is attached to die attachment area 91, such as by similar die attachment techniques. The material used for forming die attachment area 91 usually is larger than the area of die 74. The leadframe may also include a plurality of other leads, such as a lead 96 that forms terminal 41. The top surface of die 74 includes a plurality of bonding or attachment pads that are utilized for electrically connecting elements of circuit 24 as illustrated in FIG. 1. Typically, wire bonds or multiple wire bonds are utilized to provide the electrical connections. For example, a first wire bond may be utilized to connect voltage return 27 of driver 25 to a source connection pad 81 of die 13, thus to the source of transistor 12. This facilitates the driver return voltage and the source of transistor 12 having the same voltage independently of the inductance of inductor 21 and resistor 22. This also facilitates transistor 12 switching faster. A second wire bond may be utilized to connect output 29 of driver 25 to a gate connection pad 82 of die 13, thus to the gate of transistor 12. Another wire bond 83 may be utilized to connect the gate of transistor 12 to lead 84, thus to terminal 45. A third wire bond 94 may be utilized to connect output 35 of driver 31 to a gate connection area 59 of transistor 16, thus to the gate of transistor 16. In some embodiments, output 35 and the gate of transistor 16 may also be connected to a terminal or multiple terminals 50 of device 10. Other wire bonds may be utilized to connect terminals 43 and 41 to circuit 24. Those skilled in the art will appreciate that the wirebonds are just an example of common techniques for forming electrical connections to semiconductor die and that other well-known techniques may also be used.

A connection clip 61 is configured to commonly connect the source of die 13 to the drain of die 17 and to lead connection area 70, thus, to leads 71 and terminal 49. Clip 61 generally is formed from a metal conductor that has a low resistance, such as copper or the like. Those skilled in the art will appreciate that the large surface area and high conductivity of clip 61 provides a low resistance path that can conduct a large current and provides a low inductance, thus, clip 61 minimizes the value of inductor 21 and resistor 22 illustrated in FIG. 1. As illustrated by the configuration of die 13 and 17, the use of one clip 61 to form electrical connection to both die 13 and 17 and to leads 71 reduces the inductance and resistance and improves the performance of device 10. Additionally, connecting the source of transistor 16 directly to die attachment area 75, thus to leads 79 and terminal 48, minimizes the inductance in the connection between the source of transistor 16 and the connection to the common return, thereby minimizing the inductance between the source of transistor 16 and the common return of driver 31. The width and thickness of clip 61 assists in reducing inductance, thus, the width of clip 61 and of portions 62 and 63 should be as wide as allowable by the connections to the associated semiconductor die and other package constraints. Minimizing this inductance reduces the value of the di/dt voltage formed at the source of transistor 12 and at the drain of transistor 16 thereby minimizing the possibility of damage to driver 31 and/or to transistors 12 and/or 16. Furthermore, the lower inductance provided by clip 61 minimizes circuit oscillations during the switching of transistor 12 which in turn minimizes the voltage at the drain of transistor 16 thereby minimizing voltage and/or current stress to transistors 12 and/or 16 and driver 31. Consequently, damage thereto is minimized. The lower inductance additionally prevents transistor 16 from turning on when transistor 12 is on which reduces cross conduction therebetween, and can also minimize oscillations.

Figure 4:
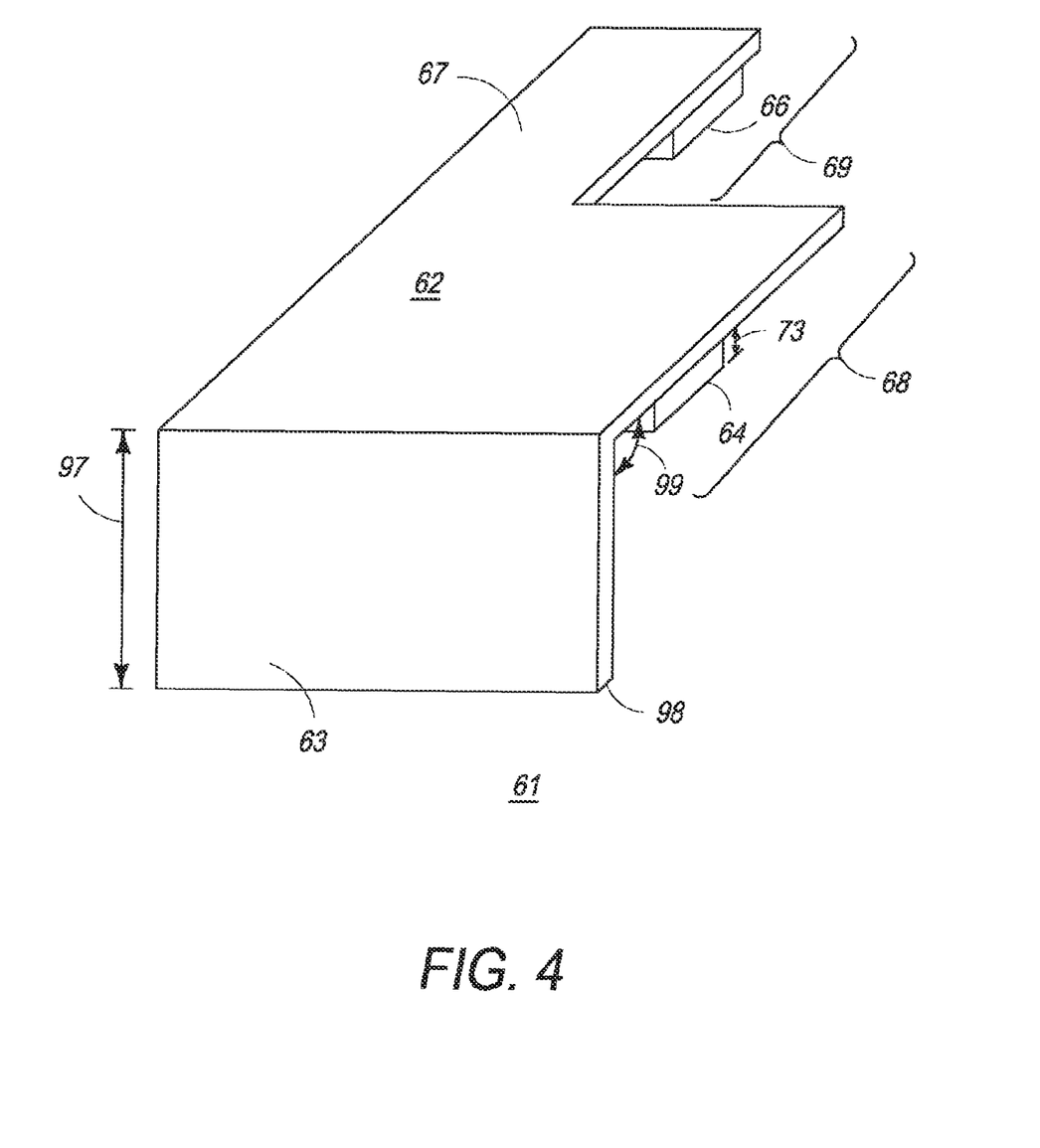
FIG. 4 illustrates an isometric view of a portion of an example of an embodiment of a connection clip of the semiconductor package of FIG. 2 in accordance with the present invention.

FIG. 4 illustrates an isometric view of a portion of an example of an embodiment of clip 61. A first portion 62 of clip 61 extends laterally along a first direction. Portion 62 has a top surface 67 and a die attach surface 65 that is opposite surface 67. A first region 68 of portion 62 is formed to have a larger area than a second region 69 of portion 62. The different areas are formed because the two die to which clip 61 is attached have two different connection areas. Also, the smaller area of region 69 facilitates forming more than one connection to the surface of die 13 so that region 69 does not cover the entire area of die 13 and leaves room for using other connections to connect the gate of transistor 12 and the source of transistor 12 to respective portions of driver 25. A first clip connection area 64 extends from surface 65 in region 68 and is used to electrically attach to the drain of die 17. The surface area of connection area 64 usually is approximately the same as the surface area of the drain connection pad of die 17, but may be different in other embodiments. The large surface area facilitates the low resistance and inductance of clip 61. The area of portion 68 typically is greater than the area of connection area 64. A second clip connection area 66 extends from surface 65 in region 69 and is used to electrically attach to the source of die 13. The surface area of connection area 66 usually is approximately the same as the surface area of the source connection pad of die 13, but may be different in other embodiments. The large surface area facilitates the low resistance and inductance of clip 61. The area of portion 69 typically is greater than the area of connection area 66. Areas 64 and 66 extend a first distance 73 away from surface 65 in order to provide a connection pad for attaching to the pads of die 13 and 17. In other embodiments, areas 64 and 66 may not both extend the same distance.

A second portion 63 of clip 61 extends away from portion 62 in a plane that is different from the plane of portion 62. Portion 63 extends a distance 97 away from portion 62 at an angle 99. In the preferred embodiment, distance 97 is greater than distance 73. In other embodiments, distance 97 may not be greater than distance 73. Also in the preferred embodiment, angle 99 is approximately 90 degrees. In another embodiment, angle 99 may have different values in order to accommodate different heights of die and/or different package configurations. A connection area 98 of portion 63 is used to form an electrical and mechanical connection to lead connection area 70 of the leadframe.

Figure 5:
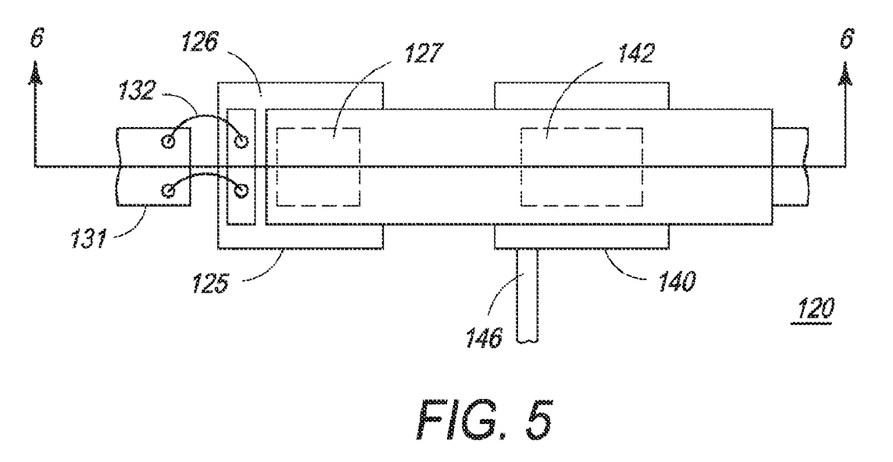
FIG. 5 illustrates a plan view of a portion of a semiconductor package that includes at least a portion of a semiconductor device in accordance with the present invention.

FIG. 5 illustrates a plan view of a portion of a semiconductor package 120 that is an alternate embodiment of package 55.

Figure 6:
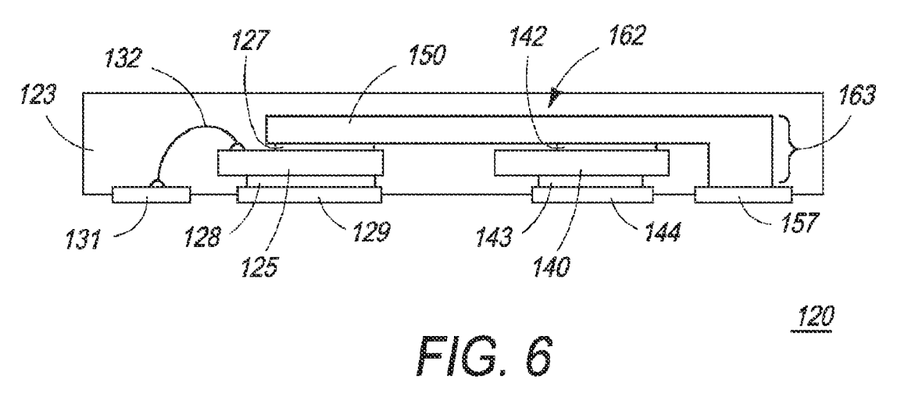
FIG. 6 illustrates a cross-sectional view of a portion of the semiconductor package of FIG. 5 in accordance with the present invention.

FIG. 6 illustrates a cut-away isometric view of a portion of semiconductor package 55 along cross-section line 6-6. This description has references to FIG. 5 and FIG. 6. FIG. 5 illustrates package 55 without an encapsulant 123 that is illustrated in FIG. 6. In the preferred embodiment, package 120 generally is a QFN package that includes at least 4 terminals. In other embodiments, package 120 may be other package styles such as a PLCC or DIP package and may have more or fewer external connection terminals. Package 120 includes a leadframe that includes die attachment areas for attaching semiconductor die such as transistors 125 and 140. Transistors 125 and 140 generally are similar to respective transistors 12 and 16 that are explained in the description of FIGS. 1-4. A first die attachment area 144 of the leadframe is formed for receiving a first semiconductor die on which transistor 140 is formed. In one embodiment, the material for area 144 is used to form a terminal for forming an external connection to transistor 140. A second die attachment area 129 of the leadframe is formed to receive a second semiconductor die on which transistor 125 is formed. In one embodiment, the material for area 129 is used to form a terminal for forming an external connection to transistor 125. Typically, the source of transistor 140 is attached to area 144 and the drain of transistor 125 is attached to area 129. A die attach material 128 and 143 may be used to attach respective transistors 125 and 140 to respective areas 129 and 144. The leadframe of package 120 also generally includes a terminal 157 that is configured to form a common connection to the source of transistor 125 and to the drain of transistor 140. A connection clip 150 is used to connect the source of transistor 125 and to the drain of transistor 140. Clip 150 is similar to clip 61 that was explained in the description of FIGS. 1-4. Clip 150 may be mechanically and electrically attached to a source connection pad or area 127 of transistor 125 and to a drain connection pad or area 142 of transistor 140 in order to connect to the source and drain of respective transistors 125 and 140. Clip 150 may include a top clip portion 162 and a clip connection portion 163 that are similar to respective portions 62 and 63 of clip 61. Clip 150 provides package 120 advantages similar to the advantage provided by clip 61. Clip 150 may also have clip connection areas that are similar to clip connection areas 64 and 66 of clip 61. Those skilled in the art will appreciate that in another embodiment, terminal 157 may be omitted and that portion 163 of clip 150 may be formed to extend to a position that would be occupied by terminal 157 so that the end of portion 163 functions as terminal 157. Those skilled in the art will also appreciate that in one embodiment, clip 150 is the same as clip 61.

A terminal 131 of package 120 may be used to form a connection to the gates of transistors 125 and 140. Typically a bonding wire 132 or plurality of bonding wires may be used to connect terminal 131 to a gate connection 126 of transistor 125. A portion of the material of terminal 131 may extend to connect to the gate of transistor 140. An optional terminal 146 may be used to form a connection to the gate of transistor 140 separate from or instead of the gate of transistor 125.

From all the foregoing one skilled in the art can determinate that according to one embodiment, a semiconductor device may comprise:

a leadframe for receiving semiconductor die, the leadframe having a first die attachment area for receiving a first semiconductor die, for example die 17, having a second die attachment area for receiving a second semiconductor die, for example die 13, and having a lead connection area; the first semiconductor die having a first MOS transistor, the first MOS transistor having a source mechanically attached to the first die attachment area; the second semiconductor die having a second MOS transistor, the second MOS transistor having a drain mechanically attached to the second die attachment area; and a connection clip, for example clip 61, mechanically and electrically connected to the drain of the first MOS transistor, to the source of the second MOS transistor, and to the lead connection area wherein a first portion of the connection clip extends to attach to both the first and second semiconductor die and wherein a second portion of the connection clip extends away from the first portion to make electrical connection to the lead connection area of the leadframe.

According to another embodiment, the leadframe may include a third die attachment area. In another embodiment, the semiconductor device may also include a third semiconductor die attached to the third die attachment area, the third semiconductor die having a first electrical connection to a gate of the first MOS transistor and a second electrical connection to a gate of the second MOS transistor.

In other embodiments, the second portion of the connection clip may extend at a first angle away from the first portion of the connection clip, or/also the first portion of the connection clip may have a first connection pad attached to the drain of the first semiconductor die and a second connection pad may be attached to the source of the second semiconductor die wherein the first connection pad overlies the drain of the first semiconductor die and the second connection pad overlies the source of the second semiconductor die.

In still another embodiment, a method of forming a connection clip for interconnecting a plurality of semiconductor die may comprise:

forming a first portion of the connection clip (portion 62 for example) having first and second surfaces (such as regions 68 and 69 for example) that extend co-parallel in a first direction; forming a first connection pad (Such as area 64 for example) on the first surface, the first connection pad having an area for electrically and mechanically connecting to a first semiconductor die; forming a second connection pad (for example area 66) on the first surface, the second connection pad having an area for electrically and mechanically connecting to a second semiconductor die wherein the connection clip also forms an electrical connection between the first and second connection pads; and forming a second portion of the connection clip (portion 63 for example) extending in a plane and at an angle (angle 99 for example) away from the first portion of the connection clip including forming the second portion of the connection clip electrically connected to the first and second connection pads.

Another embodiment may further include forming the first portion of the connection clip to have a first region (for example a region 68) formed to have a larger area than a second region (a region 69 for example) of the first portion. In still another embodiment, a method of forming a semiconductor package may comprise: forming a leadframe having a first die attachment area for mechanically attaching to a first current carrying electrode of a first transistor, having a second die attachment area for mechanically attaching to a first current carrying electrode of a second transistor, and having a connection area for attaching to a connection clip configured to electrically couple a second current carrying electrode of the first and second transistors to the connection area.

Another embodiment may further include forming the leadframe having a third die attachment area for mechanically attaching to a third semiconductor die that is different from the first and second transistors.

Those skilled in the art will also appreciate that another embodiment may include a semiconductor device comprising: a leadframe for receiving semiconductor die, the leadframe having a first die attachment area, for example area 75, for receiving a first semiconductor die, such as die 17 for example, having a second die attachment area, area 85 for example, for receiving a second semiconductor die, die 13 for example;

the first semiconductor die having a first MOS transistor, the first MOS transistor having a source mechanically attached to the first die attachment area;

the second semiconductor die having a second MOS transistor, the second MOS transistor having a drain mechanically attached to the second die attachment area; and a connection clip, clip 61 for example, mechanically and electrically connected to the drain of the first MOS transistor and to the source of the second MOS transistor wherein a first portion of the connection clip, such as portion 61, extends to attach to both the first and second semiconductor die and wherein a second portion, portion 63 for example, of the connection clip extends away from the first portion to provide an electrical connection to the drain of the first MOS transistor and to the source of the second MOS transistor. The ordinary skilled artisan will understand that in another embodiment, a method of forming a semiconductor package may comprise: forming a leadframe, such as the leadframe of package 55 for example, having a first die attachment area, area 75 for example, for mechanically attaching to a first current carrying electrode of a first transistor, transistor 17 for example, having a second die attachment area, area 85 for example, for mechanically attaching to a first current carrying electrode of a second transistor, such as transistor 13 for example, and forming the semiconductor package with a connection clip, clip 61 for example, configured to electrically couple a second current carrying electrode of the first and second transistors to a terminal of the semiconductor package.

In view of all of the above, it is evident that a novel device and method is disclosed. Included, among other features, is forming a leadframe for a semiconductor package with connection areas for a source of a first transistor and a drain of a second transistor, and configured to use a single connection clip to provide a low resistance and low inductance connection between the opposite drain and opposite source of the two transistors and to a common external connection, such as a switch node. Configuring the leadframe to attach the source of the first die and the drain of the second die directly to the leadframe reduces the inductance in the source of the first transistor and reduces the di/dt voltage at the source of first transistor and at the output of the driver for the first transistor.

While the subject matter of the descriptions are described with specific preferred embodiments and example embodiments, the foregoing drawings and descriptions thereof depict only typical and exemplary embodiments of the subject matter and are not therefore to be considered to be limiting of its scope, it is evident that many alternatives and variations will be apparent to those skilled in the art.

Those skilled in the art will appreciate that the details of device 10 are used as a vehicle to explain one example embodiment of the present invention and that many other configurations are possible as long as the configuration includes a single connection clip, such as clip 61 or 150, to provide a low resistance and low inductance connection between the opposite drain and source of the two transistors and to a common external connection. Additionally, those skilled in the art will understand that the configurations explained for clips 61 and 150 are just two examples of the configuration of the clip as long as the configuration includes a single connection clip to provide a low resistance and low inductance connection between the opposite drain and source of the two transistors and to a common external connection.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A semiconductor device comprising:
a leadframe for receiving semiconductor die, the leadframe having a first die attachment area for receiving a first semiconductor die, having a second die attachment area for receiving a second semiconductor die, and having a third die attachment area for receiving a third semiconductor die wherein the third die attachment area is not electrically connected within the leadframe to the first die attachment area;
the first semiconductor die having a first MOS transistor, the first MOS transistor having a source mechanically attached to the first die attachment area;
the second semiconductor die having a second MOS transistor, the second MOS transistor having a drain mechanically attached to the second die attachment area; and
a connection clip mechanically and electrically connected to the drain of the first MOS transistor, to the source of the second MOS transistor, wherein a first portion of the connection clip extends to attach to both the first and second semiconductor die and wherein a second portion of the connection clip extends away from the first portion to provide an electrical connection to the drain of the first MOS transistor, to the source of the second MOS transistor.

2. The semiconductor device of claim 1 further including the leadframe having a lead connection area wherein the second portion of the connection clip extends to the lead connection area and makes electrical and mechanical connection to the lead connection area.

3. The semiconductor device of claim 1 wherein the first and second die attachment areas are substantially co-planar to each other.

4. The semiconductor device of claim 1 further including a third semiconductor die attached to the third die attachment area, the third semiconductor die having a first electrical connection to a gate of the first MOS transistor and a second electrical connection to a gate of the second MOS transistor, the third semiconductor die having a common return that is not electrically connected within the semiconductor device to the second die attachment area.

5. The semiconductor device of claim 1 wherein the second portion of the connection clip extends at a first angle away from the first portion of the connection clip.

6. The semiconductor device of claim 1 wherein the first portion of the connection clip has a first connection pad attached to the drain of the first semiconductor die and a second connection pad attached to the source of the second semiconductor die wherein the first connection pad overlies the drain of the first semiconductor die and the second connection pad overlies the source of the second semiconductor die.

7. The semiconductor device of claim 6 wherein the first connection pad and the second connection pad extend respective first and second distances from a surface of the first portion of the connection clip and wherein the second portion of the connection clip extends a third distance away from the first portion of the connection clip wherein the third distance is greater than either of the first or second distances.

8. The semiconductor device of claim 1 wherein the first and second die attachment areas of the leadframe have one of leads extending from the first and second die attachment areas or half-etched pads extending from the first and second die attachment areas.

9. The semiconductor device of claim 8 further including a third semiconductor die attached to the third die attachment area, the third semiconductor die have a first electrical connection to a gate of the first MOS transistor, a second electrical connection to a gate of the second MOS transistor, and a third electrical connection to a lead of the leadframe to receive a signal from external to the semiconductor device.

10. The semiconductor device of claim 1 further including an encapsulaht covering portions of the connection clip, the first and second semiconductor die, and a portion of the leadframe.

11. A method of forming a semiconductor package comprising:
   forming a leadframe having a first die attachment area for mechanically attaching to a first current carrying electrode of a first transistor, having a second die attachment area for mechanically attaching to a first current carrying electrode of a second transistor;
   forming a third die attachment area on the leadframe for mechanically attaching to a third semiconductor die that is different from the first and second transistors, the third die attachment area separated from both the first and second die attachment areas; and
   forming the semiconductor package with a connection clip configured to electrically couple a second current carrying electrode of the first and second transistors to a terminal of the semiconductor package.

12. The method of claim 11 further including forming the first and second die attachment areas to be substantially co-planar.

13. The method of claim 11 further including forming the semiconductor package having a source of the first transistor attached to the first die attachment area, a drain of the second transistor attached to the second die attachment area, and the connection clip electrically attached to a drain of the first transistor and to a source of the second transistor wherein a portion of the connection clip provides a common electrical connection to the source of the first transistor and to drain of the second transistor.

14. The method of claim 11 further including forming the leadframe having a connection area for attaching to the connection clip wherein the connection clip electrically couples the second current carrying electrode of the first and second transistors to the connection area.

15. The method of claim 11 wherein forming the third die attachment area includes forming the third die attachment area not electrically connected within the semiconductor package to either the first or second die attachment area.

16. The method of claim 11 wherein forming the third die attachment area includes forming the third die attachment area as a separate material that is not a part of the material used to form either of the first or second die attachment areas.

17. The method of claim 11 further including
   forming a first portion of the connection clip having first and second surfaces that extend co-parallel in a first direction;
   forming a first connection pad on the first surface, the first connection pad having an area for electrically and mechanically connecting to the first semiconductor die;
   forming a second connection pad on the first surface, the second connection pad having an area for electrically and mechanically connecting to the second semiconductor die wherein the connection clip also forms an electrical connection between the first and second connection pads; and
   forming a second portion of the connection clip extending in a plane and at an angle away from the first portion of the connection clip including forming the second portion of the connection clip electrically connected to the first and second connection pads.

18. The method of claim 17 including forming the connection clip from one continuous piece of metal.

19. The method of claim 17 wherein forming the second portion of the connection clip includes forming the second portion of the connection clip to extend a distance from the first surface of the connection clip that is greater than a distance the first and second connection pads extend from the first surface.

20. The method of claim 17 further including forming the first portion of the connection clip to have a first region formed to have a larger area than a second region of the first portion.

* * * * *